(12) United States Patent
Moscatelli et al.

(10) Patent No.: US 6,888,205 B2
(45) Date of Patent: May 3, 2005

(54) METAL OXIDE SEMICONDUCTOR FIELD-EFFECT TRANSISTOR HAVING A GATE OXIDE LAYER WITH PORTIONS OF DIFFERENT THICKNESSES AND ASSOCIATED METHODS

(75) Inventors: Alessandro Moscatelli, Como (IT); Giuseppe Croce, Villasanta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/325,653

(22) Filed: Dec. 20, 2002

(65) Prior Publication Data

US 2003/0141559 A1 Jul. 31, 2003

(30) Foreign Application Priority Data

Dec. 20, 2001 (EP) ............................................. 01830786

(51) Int. Cl.[7] ............................................. H01L 29/94
(52) U.S. Cl. ...................... 257/406; 257/377; 257/389; 257/390; 257/407; 257/408; 257/409; 257/413
(58) Field of Search ................................. 257/377, 389, 257/390, 406, 407, 408, 409, 413

(56) References Cited

U.S. PATENT DOCUMENTS

| | | | |
|---|---|---|---|
| 4,300,150 A | 11/1981 | Colak | 357/23 |
| 4,989,058 A | 1/1991 | Colak et al. | 357/23.8 |
| 5,382,535 A | * 1/1995 | Malhi et al. | 438/194 |
| 5,501,994 A | 3/1996 | Mei | 437/40 |
| 5,801,416 A | 9/1998 | Choi et al. | 257/335 |
| 5,973,368 A | 10/1999 | Pearce et al. | 257/368 |
| 6,077,749 A | 6/2000 | Gardner et al. | 438/299 |
| 6,107,160 A | 8/2000 | Hebert et al. | 438/454 |
| 6,121,666 A | 9/2000 | Burr | 257/408 |
| 6,218,712 B1 | 4/2001 | Shimizu | 257/384 |
| 6,451,679 B1 | * 9/2002 | Hu et al. | 438/592 |
| 2002/0008295 A1 | * 1/2002 | Yang et al. | 257/413 |
| 2002/0063266 A1 | * 5/2002 | Lee | 257/200 |
| 2002/0072186 A1 | * 6/2002 | Evans | 438/306 |

FOREIGN PATENT DOCUMENTS

EP    0 399 527    11/1990    ........... G11C/16/02

OTHER PUBLICATIONS

Patent abstracts of Japan, Publication No. 2001015741 published on Jan. 19, 2001. Applicant: Toshiba Corp; Inventor: Nakagawa Akio. Title: Field Effect Transistor.

Patent Abstracts of Japan, "Field Effect Transistor", Publication No. 2001015741 published Jan. 19, 2001. Applicant: Toshiba Corp; Inventor: Nakagawa Akio.

* cited by examiner

*Primary Examiner*—Minhloan Tran
*Assistant Examiner*—Tan Tran
(74) *Attorney, Agent, or Firm*—Lisa K. Jorgenson; Allen, Dyer, Doppelt, Milbrath & Gilchrist, P.A.

(57) ABSTRACT

A metal oxide semiconductor transistor integrated in a wafer of semiconductor material includes a gate structure located on a surface of the wafer and includes a gate oxide layer. The gate oxide layer includes a first portion having a first thickness and a second portion having a second thickness differing from the first thickness.

21 Claims, 9 Drawing Sheets

METAL OXIDE SEMICONDUCTOR FIELD-EFFECT TRANSISTOR HAVING A GATE OXIDE LAYER WITH PORTIONS OF DIFFERENT THICKNESSES AND ASSOCIATED METHODS

FIELD OF THE INVENTION

The present invention relates to metal oxide semiconductor field-effect transistors (MOSFETs).

BACKGROUND OF THE INVENTION

For the purposes of the present invention, the expression "metal oxide semiconductor field-effect transistors" (MOSFET) denotes various field-effect transistor structures, each including a wafer of semiconductor material, also called the substrate or body, a drain region and a source region integrated in the wafer, and a gate structure including a layer of conductive material separated from the wafer by a layer of insulating material (typically an oxide, such as silicon dioxide). It should be noted that the expression "metal oxide semiconductor" (MOS) is also used for transistors in which the layer of conductive material of the gate is formed by a layer of doped polysilicon, instead of metal. It should also be mentioned that metal oxide semiconductor transistors are also called insulated-gate field-effect transistors (IGFET, insulated-gate FET), to emphasize that the gate electrode is electrically insulated from the wafer or body.

For example, for the purposes of the present invention the term MOSFET is applied not only to transistors having the standard structure, such as the conventional NMOS and PMOS transistors, but also lateral double-diffusion MOS-FETs (LDDMOSFET or LDMOSFET), or other possible MOSFET structures comprising a different number of diffused regions and/or a different arrangement thereof in the substrate, as well as different combinations of the dopants. It is known that an LDMOSFET, referred to for brevity below as an LDMOS transistor, comprises, in addition to the drain and gate regions, a body region which is also diffused under the gate oxide and a drift region associated with the drain.

As is known, one of the parameters characterizing a MOSFET is the breakdown voltage BV. With reference to LDMOS transistors for example, the breakdown voltage BV is the voltage of the drain electrode at which the junction between the drain and body is subject to an avalanche effect (avalanche breakdown). The breakdown voltage BV is correlated with the dopants of the drain (or drift) and body regions and with the curvature and denser spacing of the lines of potential induced by the gate electrode. In the known art, two different methods are used to obtain sufficiently high values of breakdown voltage (BV) in MOS or LDMOS transistors.

In the first method, the doping of the drain and body regions is appropriately determined, and, in particular, the doping of the drain region is reduced. This method has the disadvantage of decreasing the performance of the transistor, causing an increase in its series resistance (Ron). The second conventional method proposes the use of a relatively thick gate oxide layer. This approach has the disadvantage of reducing the transconductance Gm and the current-carrying capacity of the LDMOS transistor, thus decreasing the performance of the transistor in terms of gain.

In the known art, therefore, in the case of LDMOS transistors, the doping and thickness of the gate oxide must be determined in such a way as to provide a compromise between the requirements of a suitable breakdown voltage, a convenient gain and an adequate series resistance, and this compromise cannot be considered to be wholly satisfactory.

SUMMARY OF THE INVENTION

An object of the present invention is to provide a metal oxide semiconductor field-effect transistor which overcomes the limitations of conventional transistors.

An object of the present invention is achieved by a metal oxide semiconductor integrated in a wafer of semiconductor material and comprising a gate structure located on one surface of the wafer and including a gate oxide layer. The gate oxide layer includes a first portion having a first thickness and a second portion having a second thickness that is different from the first thickness.

Another object of the present invention is to provide a method for manufacturing such a metal oxide semiconductor field-effect transistor.

BRIEF DESCRIPTION OF THE DRAWINGS

The characteristics and advantages of the present invention will be more clearly understood from the following detailed description of examples of its embodiment provided without restrictive intent, and illustrated in the attached drawings, in which:

FIGS. 1a to 4 are schematic cross-sectional views illustrating different stages of production of an LDMOS transistor according to a particular embodiment of the invention;

DETAILED DESCRIPTION OF THE PREFERRED EMBODIMENTS

In the figures to which the following description refers, the same numerical references will be used to indicate identical or similar elements.

With reference to FIGS. 1a to 4, a description will be given of a particular example of a process of manufacturing an LDMOS transistor integrated in a wafer 30 of semiconductor material according to the invention. Preferably, the LDMOS transistor of this example is of a type which can be used for radio-frequency power applications. However, as mentioned above and as will be evident to persons skilled in the art, the teachings of the present invention are also applicable to MOSFETs of types other than those described here by way of example.

Figure 1A:
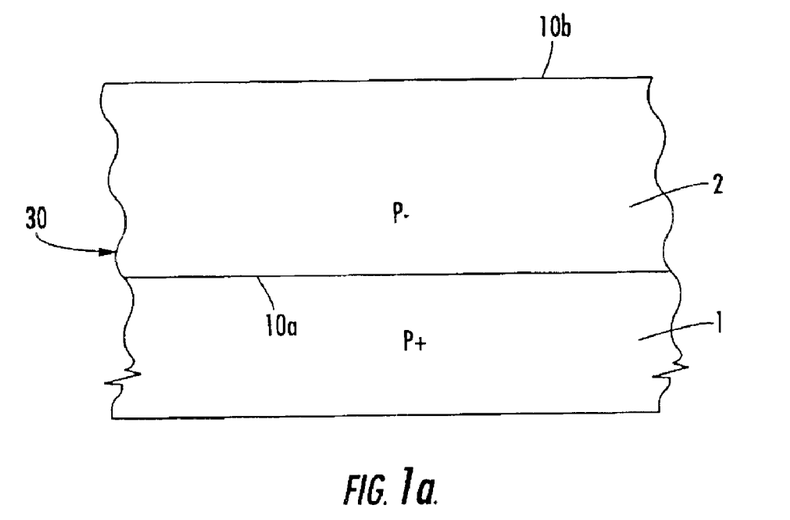

According to the example, the wafer 30 is of the $P^+$-$P^-$ type, in other words of the type normally used for CMOS platforms, and comprises a $P^+$-type silicon substrate 1 and a $P^-$-type epitaxial layer 2 grown on the substrate by conventional methods. The epitaxial layer 2 forms a separating surface 10a between the substrate 1 and an outer surface 10b opposed to it. The epitaxial layer 2 has a conductivity of the same type as that of the substrate 1, but smaller than this. For example, in terms of resistivity, the silicon substrate 1 has a resistivity in the range from 1 to 100 mΩ/cm and a thickness in the range from 10 μm to 1000 μm. In a particular example, at the end of the production process the thickness of the substrate 1 is 200 μm. The epitaxial layer 2 has a resistivity which is, for example, in the range from 1 to 100 Ω/cm, and has a thickness which is, for example, in the range from 1 to 10 μm.

Figure 1B:
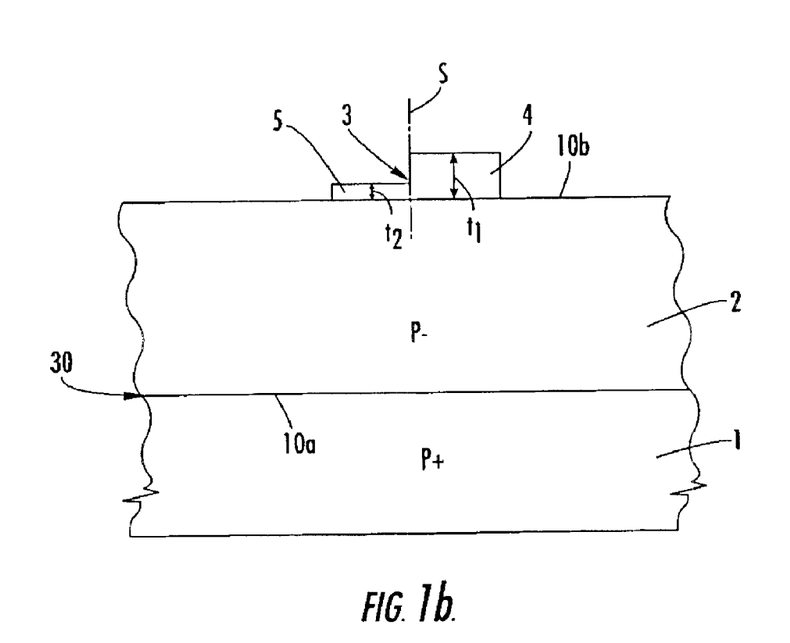

The method according to the invention comprises the formation of an insulating gate layer 3 on the surface 10b. The insulating gate layer 3 can be made from any suitable dielectric material. For example, the insulating gate layer 3 can be an oxide, particularly silicon dioxide. The gate oxide 3 has a non-uniform thickness and comprises a first portion 4 having a thickness t1 and a second portion 5 having a thickness t2 which is different from the thickness t1. As is shown clearly in FIG. 1b, the "thickness of the gate oxide" denotes the distance between the surface of the gate oxide facing the surface 10b of the wafer 30 and the opposite surface of the gate oxide. In FIG. 1b, the first portion 4 and the second portion 5 are located on opposite sides of an ideal separating surface S.

In particular, the thickness t1 of the first portion 4 is greater than the thickness t2 of the second portion 5. For example, the thickness t1 is in the range from 20 Å to 500 Å and the thickness t2 is in the range from 10 to 250 Å. Preferably, for radio-frequency power applications, the thickness t1 is in the range from 100 Å to 300 Å and the thickness t2 is in the range from 25 to 150 Å. In one particular example, the thickness t1 is approximately 180 Å and the thickness t2 is approximately 70 Å.

A description is given below (FIGS. 2a–2e) of a particularly advantageous method which can be used, starting with the wafer 30 of FIG. 1a, to form a gate structure, a body region and a drift region of the LDMOS transistor. In particular, according to the example, the gate structure includes the gate oxide 3 and a layer of conductive gate material such as, preferably, a layer of polysilicon. A first layer of oxide 6, having a thickness t3 in the range from t2 to t1 for example, is formed, preferably by growing, on the surface 10b of the epitaxial layer 2. According to the values given above, the layer 6 can have, for example, a thickness of t3=160 Å.

Figure 2A:
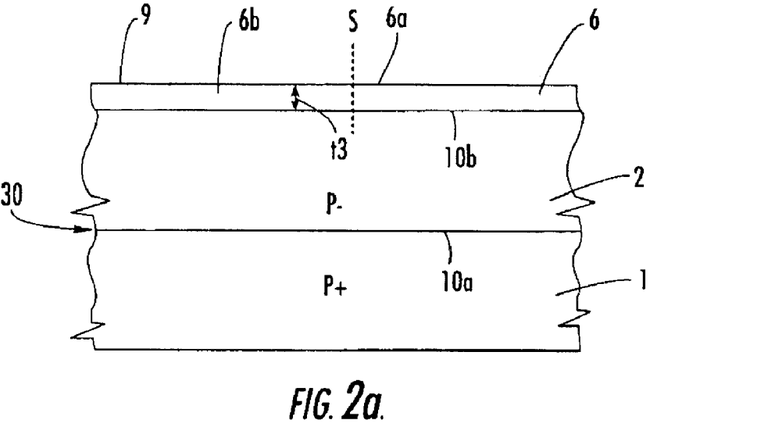
Figure 2B:
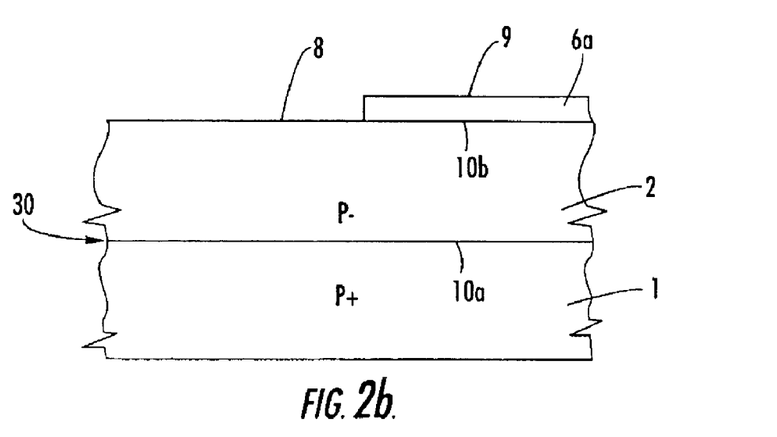

The ideal surface S for separating the two portions 4 and 5 of the gate oxide 3 is then identified in the surface 6. The surface S ideally separates the first layer of oxide 6 in a first region 6a located above the part of the surface 10b on which the first portion 4 of the gate oxide 3 will lie, and a second region 6b located above the part of the surface 10b on which the second portion 4 of the gate oxide 3 will lie. The region 6b of the layer 6 is then removed. This removal can be carried out, for example, by a conventional photolithographic method comprising a stage of forming a photoresist mask and a stage of chemical etching. In greater detail, the forming of the photoresist mask requires the use of a layer of photoresist (not shown) placed on a surface 9 of the layer of oxide 6 and the partial irradiation of this photoresist with electromagnetic waves (ultraviolet waves or X-rays, for example) which pass through a suitable photomask (not shown). The irradiation of the photoresist polymerizes the portion of the photoresist lying above the first region 6a of the oxide 6 which is not to be removed.

Figure 2C:
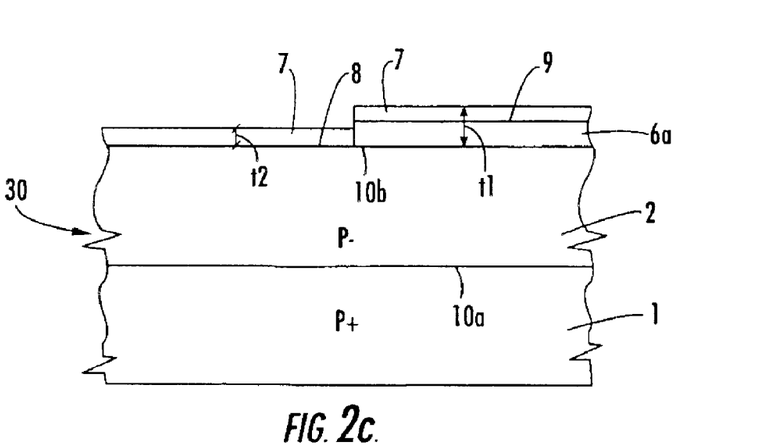
Figure 2D:
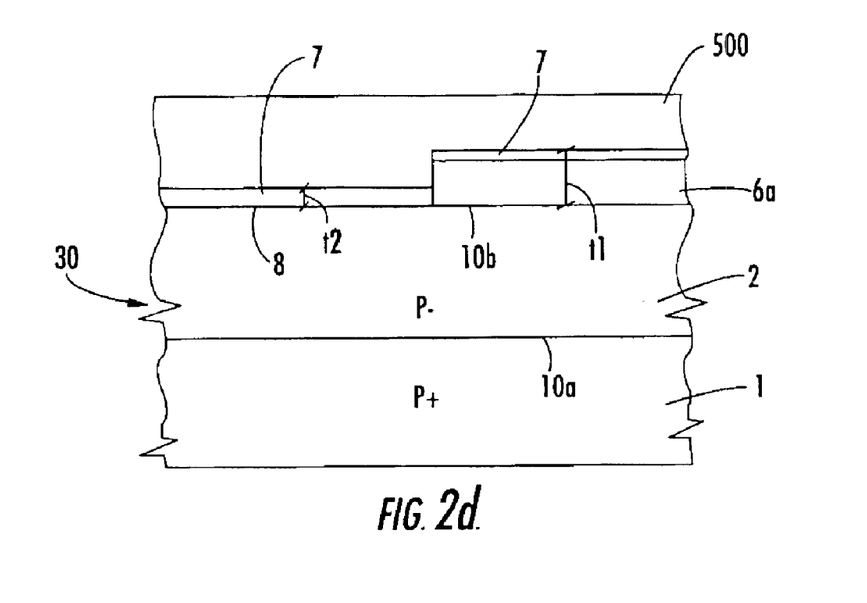
Figure 2E:
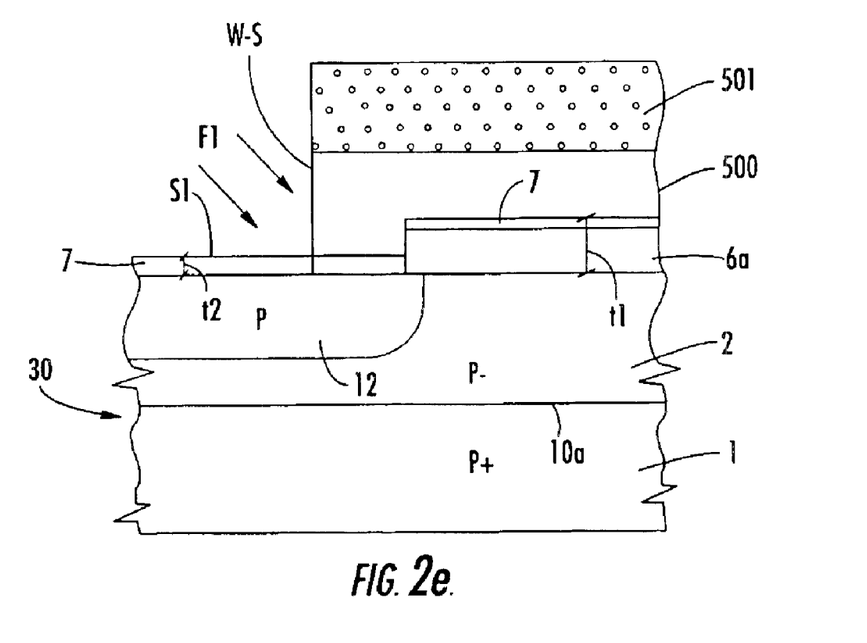

Chemical etching is then carried out to remove the non-polymerized portion of the photoresist and the underlying second region 6b of the oxide layer 6 in such a way as to expose a surface 8 of the wafer 30. Finally, the removal of the photoresist is completed. A layer of oxide 7 is then grown on the surface 8 of the wafer 30 and on a surface 9 of the second region 6a. This growing stage is carried out in such a way that the portion of the layer of oxide 7 present on the surface 8 has a thickness of t2 and the portion of the layer 7 grown on the surface 9 is such that the layers 6a and 7 have a combined thickness of approximately t1. A layer of polysilicon 500, suitably doped, is then deposited on top of the oxide layer 7, as shown in FIG. 2d, in order to make it conductive. A portion of this polysilicon layer 500 is designed to form the gate polysilicon of the transistor.

A first layer of masking made from photoresist 501, or more briefly a photoresist mask, is then formed on top of the polysilicon layer 500. This first photoresist mask 501 is produced from a layer of photoresist placed on the polysilicon layer 500 and suitably irradiated with electromagnetic waves which pass through a suitable photomask in such a way as to cause the polymerization of some of the portions of the layer. With the aid of this first photoresist mask 501, the polysilicon layer 500 is etched, by conventional methods for example, to remove the portion of the polysilicon which is not covered by the polymerized portions of this mask 501. As shown in FIG. 2a, this etching makes it possible to form a lateral wall W-S (facing the source side, for example) of the polysilicon gate layer of the transistor. It should be noted that, after the chemical etching, the first photoresist mask 501 and the polysilicon layer 500 have an aperture which exposes a surface S1 of the oxide layer 7 having a thickness t2 in the proximity of the lateral wall W-S.

According to the example, the method continues with a stage of forming a P-type body region 12 which is developed within the epitaxial layer 2. In particular, the region 12 is formed by ion implantation. Preferably, boron ions are implanted with an ion beam F1 of suitable energy and density (shown schematically by arrows in FIG. 2a) which strikes the surface S1 exposed by the photoresist mask 501, passing through the oxide layer 7.

Advantageously, an inclined implantation is carried out; in other words, the wafer 30 is inclined at a suitable angle to the ion beam F1 in such a way that the beam of ions can also pass obliquely through the polysilicon layer 500, but at the same time this polysilicon layer is shielded by the first photoresist mask 501. It should be noted that, advantageously, the first photoresist mask 501 is automatically aligned with the underlying polysilicon 500 because it is the product of the same stage of masking (and, in particular, of the same photomask) and etching as that carried out to form the wall W-S.

This provides a highly accurate alignment between the layers 500 and 501, which could not be obtained by forming a separate photoresist layer on the remaining portion of the polysilicon layer 500 after a stage of etching carried out to form the polysilicon 500. The correct alignment of the overlapping layers 500 and 501 makes the execution of the inclined implantation highly accurate. This inclined implantation is used to form a body region 12 extending over the desired length (generally fractions of a μm) under the polysilicon layer 500. On completion of the implantation, the first photoresist mask 501 is removed.

Figure 3A:
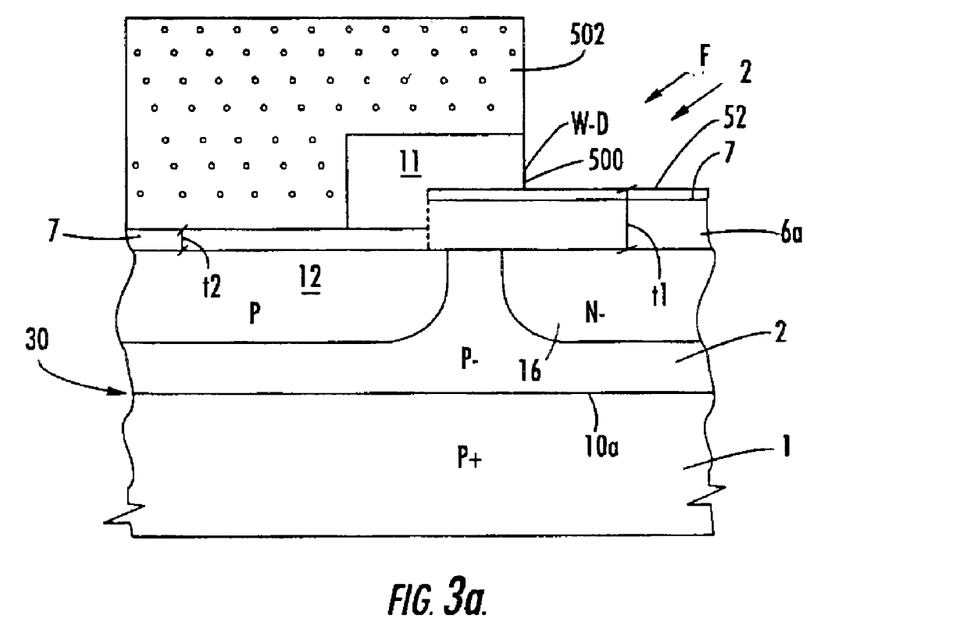

A second layer of masking made from photoresist 502, or more briefly a second photoresist mask 502, is then formed on top of the polysilicon layer 500 (FIG. 3a). This second photoresist mask 502 is produced from a layer of photoresist placed on the polysilicon layer 500 and suitably irradiated with electromagnetic waves which pass through a suitable photomask in such a way as to cause the polymerization of some of the portions of the layer.

With the aid of this second photoresist mask 502, the polysilicon layer 500 is etched, by conventional methods for example, to remove the portion of the polysilicon which is not covered by the polymerized portions of this mask 502. As shown in FIG. 3a, this etching makes it possible to form a lateral wall W-D (facing the drain side, for example) of the polysilicon gate layer of the transistor. This second etching of the polysilicon layer 500 forms a polysilicon gate layer 11. It should be noted that, after etching, the second photoresist mask 502 and the polysilicon layer 500 have an aperture which exposes a surface S2 of the oxide layer 7 having a thickness t1 in the proximity of the lateral wall W-D. Additionally, the photoresist layer 502 shields the gate polysilicon 11 and the surface of the oxide layer 7 having a thickness t2.

According to the example, the method continues with a stage of forming an N-type drift region 16 which is developed within the epitaxial layer 2. In particular, the region 16 is formed by ion implantation. Preferably, phosphorus ions are implanted with an ion beam F2 of suitable energy and density (shown schematically by arrows in FIG. 3a) which strikes the surface S2 exposed by the photoresist mask 502, passing through the oxide layers 7 and 6a. In particular, an inclined implantation is carried out in a similar way to that described for the body region 12, in such a way that the ion beam F2 can pass obliquely through the gate polysilicon 11, but at the same time this polysilicon layer is shielded by the second photoresist mask 502. Thus the implanted ions can occupy a region extending for several fractions of a $\mu$m under the gate polysilicon 11. It should be noted that, advantageously and similarly to the process described for the formation of the body region 12, the implantation of the drift region 16 is carried out with the same photoresist mask 502 as that made for the forming of the polysilicon gate layer 11, and therefore with a mask automatically aligned with the layer 11.

After the two stages of implantation of the body region 12 and the drift region 16, a stage of heat treatment is advantageously carried out to enable the corresponding dopants to be fully diffused and activated. It should be noted that this heat treatment can be identical to one of those already specified by the VLSI (Very Large Scale Integration) CMOS platform (carried out, for example, at less than 1000° C. and in particular at approximately 900° C.), and can therefore be such that there is no effect on the electrical characteristics of the CMOS components which can be formed on the said wafer 30. It should be noted that, in the conventional manufacture of LDMOS transistors not integrated with CMOS devices, the drift and body regions are produced by a diffusion process which requires heat treatment at a high temperature, generally above 1000° C. In the particular method described above according to the invention, the use of inclined implantation enables the body region 12 and drift region 16 to be extended under the polysilicon 11 even without the heat treatment.

According to a preferred example of embodiment of the invention, CMOS devices (not shown), such as conventional N- and P-channel MOSFETs, are formed on the wafer in addition to the LDMOS transistor. It is clear from the above description that the method according to the invention is compatible with the parallel formation of CMOS devices on the same wafer 30. It should also be noted that the advantages offered by inclined implantation and those offered by using the same photoresist layers for forming the polysilicon 11 and the subsequent implantation are also considerable in the manufacture of an LDMOS with a gate oxide layer having a uniform thickness.

Figure 3B:
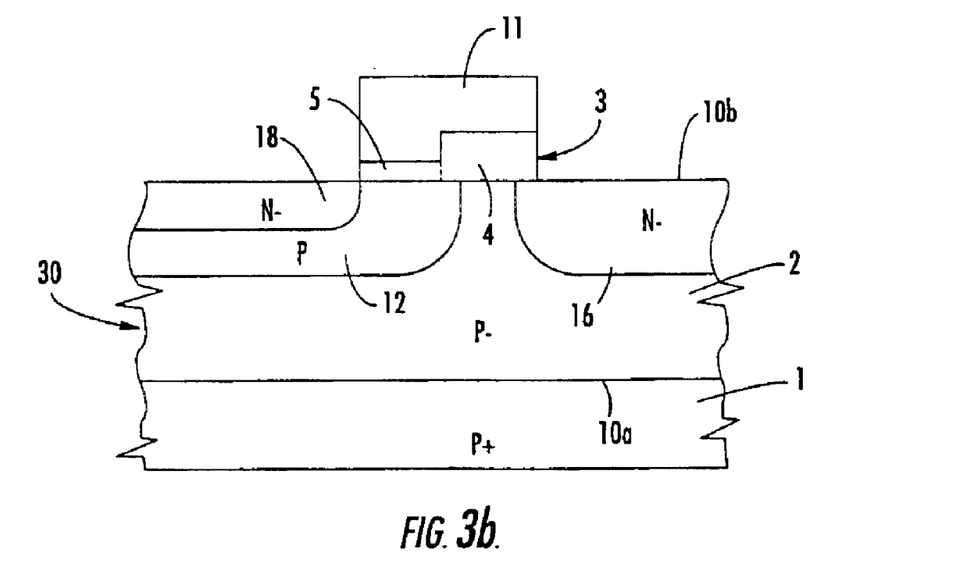

FIG. 3b shows the polysilicon gate layer 11, produced by the definition of the layer 500, and the gate oxide 3 produced after a stage of removal of the photoresist 502 and of the layers of oxide (7 and 6a) not lying under the polysilicon gate layer 11. In one embodiment of the invention, the body region 12 has a concentration of dopant impurities in the range from $10^{16}$ to $10^{19}$ ions/cm$^3$.

According to the example described, and as shown in FIG. 3b, the N$^-$-type region 18 is then formed, as is usually done for CMOS devices, in other words as an N-type region indicated conventionally by the symbol Nldd (region of weak doping) and having, in the example, a doping in the range from $10^{15}$ to $10^{19}$ ions/cm$^3$. The region 18 can be formed in a conventional way, by the formation of photoresist masks, followed by ion implantation.

Figure 4:
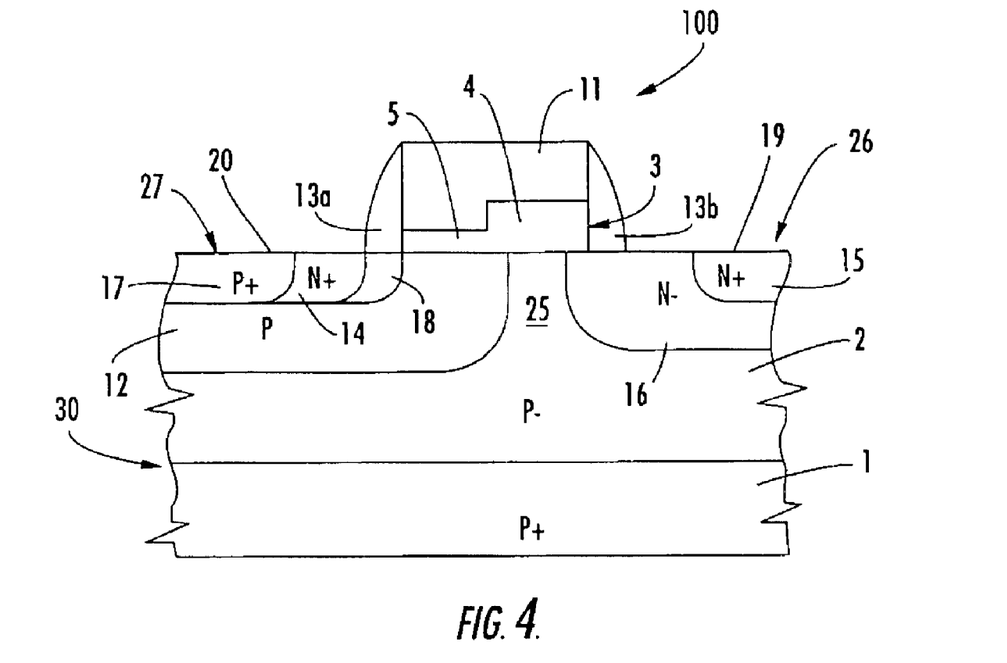

Lateral spacers 13a and 13b, illustrated in FIG. 4, are preferably formed on the lateral walls of the polysilicon gate layer 11 and of the gate oxide 3. These lateral spacers are formed by using prior art technologies comprising stages of chemical vapor phase deposition (CVD) of a suitable material, followed by a stage of reactive ion etching. The lateral spacers 13a and 13b can consist of any suitable insulating material such as silicon oxide, polysilicon, or, preferably, silicon nitride. As is known, lateral spacers are commonly used in CMOS processes to create less doped areas of the source and drain regions at the body/drain and body/source junctions, to reduce the electrical fields, and more doped areas of the source and drain regions, automatically aligned with the former areas via the spacers, for more resistive contacting.

A source region 14 and a drain region 15, both of the N$^+$ type, are then formed within the regions 18 and 16 respectively, by ion implantation through a photoresist mask, as is usually done for the source and drain regions of CMOS devices. For example, the source region 14, the drain region 15 and the drift region 16 have a conductivity in the range from $10^{15}$ to $10^{19}$ ions/cm$^3$ or, preferably, in the range from $10^{16}$ to $10^{18}$. Typically, the region 18 located on the source side is more heavily doped than the drift region 16 on the drain side.

A body contact region 17, of the p$^+$ type for example, is formed within the source region 14 in a similar way to that described above. It should be noted that the signs of the P/N conductivity of the regions 1, 2, 12, 14, 17, 19 and 15, 16 and the intensity of the corresponding doping, expressed by the symbols +/−, can differ from those indicated above by way of example and shown in the figures. Moreover, the teachings of the present invention are also applicable to LDMOS transistors having a structure different from that of the CMOS platform described, such as a structure comprising P or N substrates with or without buried layers.

It is important to note that the method described above for manufacturing an N-channel LDMOS transistor on a CMOS platform also enables P-channel LDMOS transistors to be manufactured in parallel on the same wafer 30. In other words, the method according to the present invention can be used to form complementary LDMOS transistors on a VLSI CMOS platform. A P-channel LDMOS transistor 600 which can be formed by the method described above is shown in FIG. 8. It will be noted that its layout is similar to that of the transistor of FIG. 4, except for the sign of the conductivity of some doped regions. In greater detail, the transistor 600 comprises an N$^+$ body region 12', a P$^+$ source region 14', an N+ source contact region 17', a weakly doped Nldd region 18', a P− drift region 16', and a P+ drain region 15'.

In particular, the body region 12' and drift region 16' can be produced with the same masks and implantation as those used for the body and drain regions 12 and 16 of the N-channel transistor of FIG. 4. It should be noted that the method according to the invention which makes use of inclined implantation enables the doping and the lengths of the body and drift regions to be defined in such a way as to optimize the performance of the N-channel or P-channel LDMOS.

We shall now return to the transistor of FIG. 4, indicated as a whole by 100, in which we can distinguish a first active region 26 and a second active region 27, which extend from the surface of the epitaxial layer 2 towards the interior of the said layer. The first active region 26 comprises the drain region 15 and the drift region 16. The second active region 27 comprises the body region 12, the source region 14, the body contact region 17 and the N-type region 18 located under the source spacer 13a. The first and second active regions are spaced apart from a region 25 included in the epitaxial layer 2 in which part of the transistor's conducting channel will be developed.

It should be noted that the gate oxide layer 3 extends partially over the separating regions 25 and that its first portion 4 is close to the first active region 26 and its second portion 5 is close to the second active region 27. In other words, the first portion 4 is located on the "drain side" of the transistor 100, and the second portion 5 is located on the "source side" of the said transistor. In particular, the first portion 4 and the second portion 5 are superimposed, respectively, on at least one part of the first active region 26 and at least one part of the second active region 27.

In greater detail, the first portion 4 of the gate oxide 3 extends in such a way that it is superimposed on the separating region 25 and on one part of the drift region 16, and the second portion 5 of the gate oxide 3 extends in such a way that it is superimposed on at least one part of the body region 12. It should be noted that the first portion 4 of the gate oxide 3, close to the drain region 15, has a thickness t1 which can be specified in such a way as to obtain a desired breakdown voltage BV. In particular, the breakdown voltage can be increased by increasing the thickness t1. The breakdown voltage can always be varied by the selection of the thickness t1, provided that the doping of the drain and body regions is not such that the value of the breakdown voltage is predetermined.

The increase of the breakdown voltage is correlated with an increase in the distance between the gate polysilicon layer 11 and the first active region 26. As this distance increases, there is a decrease in the electrical field responsible for the breakdown which can occur in the surface area of the epitaxial layer 2 facing the gate oxide 3 and corresponding to a portion of the polysilicon layer 11 close to the drain region 16.

Advantageously, the present invention can be used in the field of radio-frequency power applications to obtain a breakdown voltage BV which is higher than that obtainable with conventional LDMOS transistors having uniform oxide. For example, for low-voltage applications, with the values of the thicknesses t1 and t2 indicated above (180 Å and 70 Å), and where the doping of the body region 12 and drift region 16 is of the order of $10^{17}$ ions/cm$^3$, breakdown voltages BV in the range from 16–20 V have been obtained. For conventional LDMOS transistors with uniform gate oxide, having a thickness of 70 Å, and doping comparable to that indicated above, a breakdown voltage of approximately 10 V is obtained, in other words one considerably lower than that obtainable by applying the teachings of the present invention.

Additionally, the increase in the thickness t1, by permitting a limitation of the surface electrical field, reduces the undesired generation of "hot carriers" and enables the gate-drain feedback capacity to be reduced, with a consequent improvement in the performance of the transistor at high frequency. It should be noted that the second portion 5 of the gate oxide 3 has a thickness t2 which can be selected in such a way as to obtain a predetermined value of the transconductance Gm of the LDMOS transistor. The value of this transconductance is proportional to the gate-body capacity $C_{ox}$, which is inversely proportional to the distance between the gate electrode and the body region, in other words to the thickness t2 of the second portion 5. In particular, decreasing the thickness of this portion 5 produces an increase in the transconductance Gm and, therefore, an improvement in the performance of the transistor in terms of amplification gain. For example, with thicknesses t1 and t2 of 180 and 70 Å respectively, a Gm of approximately 200 mS/mm was obtained, as against approximately 80 mS/mm which is obtainable with a uniform thickness according to the prior art, and equal to 180 Å=t1=t2 with equal breakdown voltage.

The possibility of selecting the thicknesses of the first portion 4 and second portion 5 of the gate oxide 3 according to the present invention is particularly advantageous. This is because this possibility enables transistors to be produced with a high breakdown voltage BV and a high transconductance, or, at any rate, makes it unnecessary to accept a decrease of the transconductance Gm of the transistor to achieve desired values of the breakdown voltage. By applying the teachings of the invention, it is possible to achieve a dual function of increasing the transconductance Gm while maintaining the breakdown voltage BV at satisfactory levels.

Figure 5:
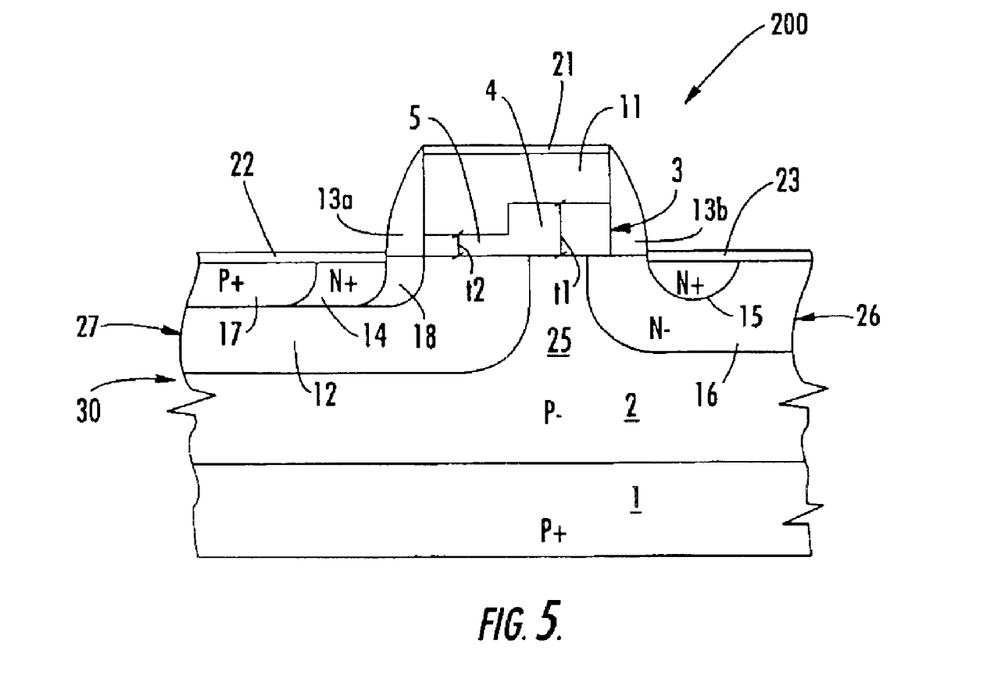
FIG. 5 is a schematic cross-sectional view illustrating an LDMOS transistor having silicide surface layers according to a first embodiment of the invention.

Advantageously, the method according to the invention provides stages of formation of silicide on suitable surfaces of the wafer 30 of FIG. 4. In FIG. 4, the reference numbers 19 and 20 indicate a first and a second area respectively, corresponding, respectively, to the surface of the first active region 26 and that of the second active region 27. FIG. 5 shows a transistor 200 with a structure similar to that of the transistor 100. The transistor 200 comprises surface layers of silicide 21, 22 and 23, formed, respectively, on the surface of the gate polysilicon 11, on the first active area 19 and on the second active area 20. The surface layers 21, 22 and 23 are, for example, formed from titanium silicide ($TiSi_2$), cobalt silicide ($CoSi_2$) or tungsten silicide ($WSi_2$).

The siliciding of the surfaces of the gate 11 and of the active areas 19 and 20 has the advantage of decreasing their surface resistivity while improving the performance of the transistor. Preferably, the siliciding is carried out by the conventional method known as self-aligned siliciding, or formation of a "salicide" (acronym of "self-aligned silicide") which permits the formation of layers of silicide aligned with the underlying regions of silicon or polysilicon (salicidizing). For example, the layers of silicide 21, 22 and 23 are formed by a stage of deposition (by spraying or "sputtering", for example) of a thin layer of a refractory metal over the whole surface of the wafer 30, and in particular over the active areas 19 and 20 and on the surface of the polysilicon layer 11.

The wafer 30 is then subjected to heating, allowing a chemical reaction to take place between the deposited metal and the underlying silicon, resulting in the formation of the three regions of silicide 21, 22 and 23. Preferably, the metal used for siliciding is titanium or cobalt. For tungsten silicide, direct deposition of $WSi_2$ on the polysilicon 11 can be used, instead of the self-aligned silicide method. It should be noted that the transistor 200, provided with the three layers of silicide 21, 22 and 23, has a particularly good performance, since the resistances of the gate, source and drain electrodes are significantly reduced. It should also be noted that the transistor 200 can have a sufficiently high breakdown voltage BV as a result of being designed with a suitable thickness t1, without significant losses in terms of transconductance.

Figure 6:
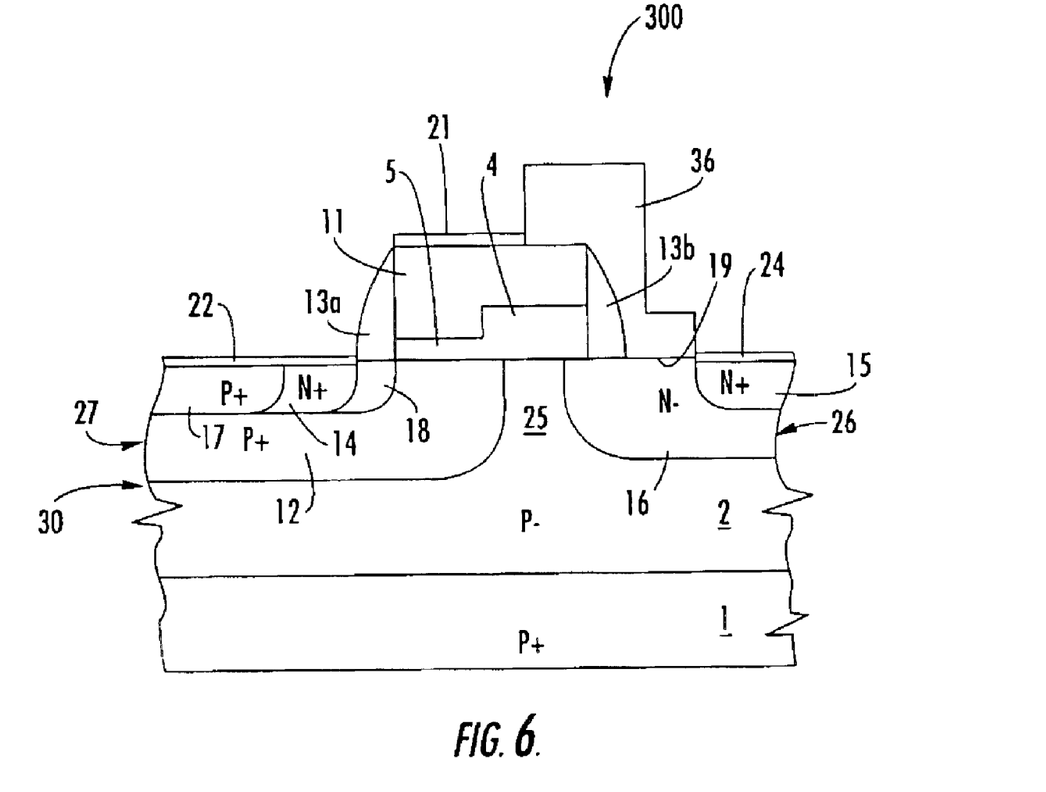
FIG. 6 is a schematic cross-sectional view illustrating an LDMOS transistor having silicide surface layers according to a second embodiment of the invention.

FIG. 6 shows a transistor 300 according to a further embodiment of the invention. In the transistor 300, the first active area 19 of the first active region 26 is only partially silicidized. In greater detail, the transistor 300 comprises a layer of silicide 24 extending over the drain region 15 but not over the portion of the drift region 16 closest to the gate structure. The transistor of FIG. 6 provides a breakdown voltage BV, for the same thickness of the first portion 4, greater than that obtainable with the transistor 200. This is due to the fact that the siliciding of the first active region is only partial, and therefore increases the "distance" between the surface of the gate polysilicon 11 and the more conductive area of the first active region 26, thus reducing the value of the electrical field which can be formed in the epitaxial layer 2 in the proximity of the gate oxide layer 3 on the side of the drain 16, for the same applied voltage. The increase in the breakdown voltage BV due to the partial siliciding is possible if the doping of the drift region is not so high as to impose a value of the breakdown voltage BV which cannot be modified.

The structure of FIG. 6 not only provides a high breakdown voltage, but also offers high performance (a high transconductance Gm for example), since the resistance of the layers of silicide 21, 22 and 24 is reduced in any case. It should be noted that the considerable advantages in terms of breakdown and performance offered by partial siliciding as shown in the solution of FIG. 6 can also be obtained for LDMOS transistors which use a gate oxide layer of the conventional type, in other words one of uniform thickness.

The transistor 300 can be produced from the transistor 100 by forming a protective or shielding element 36. In particular, the shielding element 36 is formed from electrically insulating material such as an oxide, and preferably a silicon oxide. For example, the forming of the element 36 comprises the formation of an oxide layer (not shown) over the surface of the transistor 100, the forming of a layer of photoresist positioned over this oxide layer, and the partial irradiation of this photoresist with ultraviolet rays through a suitable photomask to cause its polymerization.

Chemical etching is then carried out to remove suitable portions of the layer of photoresist and of the underlying oxide. The chemical etching forms the oxide element 36 which is positioned in such a way as to shield at least the part of the first active area 19 which is to be kept free of silicide. In particular, the precision achievable by the oxide masking process described above is such that it is possible to prevent the oxide from covering only the desired portion of the first active region 19. In this case, as shown in FIG. 6, the oxide element 36 also extends over part of the surface of the gate polysilicon 11.

After the formation of the oxide element 26, the layers of silicide 21, 22 and 24 are formed in a similar way to that described above with reference to the transistor 20 (sputtering of the metal, followed by heat treatment). The oxide element 36 shields the underlying portion of the first active area 19, which is therefore not covered by the refractory metal during the sputtering. The oxide element 36 also acts as a lateral spacer. It should be noted that the method described above for the partial siliciding of the active area 19 for the LDMOS transistor is particularly advantageous where the LDMOS transistor 300 is integrated in the wafer 30 with CMOS devices. This is because, for conventional CMOS devices, there is a known method of using total siliciding of the active area and of the gate polysilicon. The aforementioned method, in which the protective element 36 is used, enables the total siliciding of the CMOS devices to be carried out simultaneously with the partial siliciding for the LDMOS device formed in the same wafer.

Additionally, it is possible to apply in an advantageous way the process of total or partial siliciding of active areas 19' and 20' (similar to the active areas 19 and 20) and of the polysilicon layer 11' to the P-channel LDMOS transistor 600 of FIG. 8, in a similar way to that described with reference to FIGS. 5 and 6. In particular, in the partial siliciding of the active area 19', the portion of the active area 26' close to the polysilicon layer 11' is kept free of silicide, via a protective element similar to the element 36.

Figure 8:
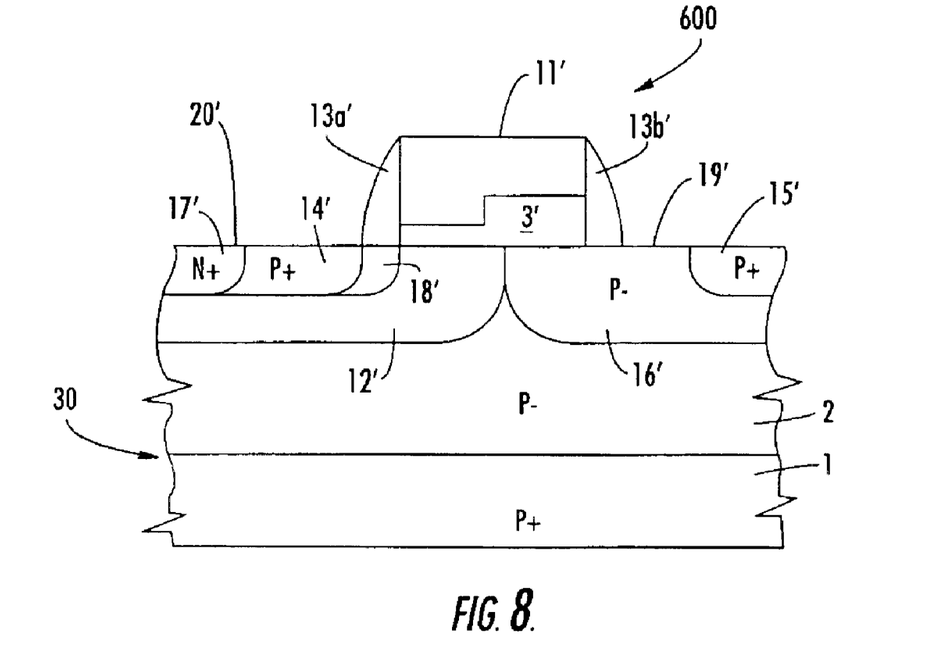
FIG. 8 is a schematic cross-sectional view illustrating a P-channel LDMOS transistor which can be constructed according to the method of the invention.
Figure 9:
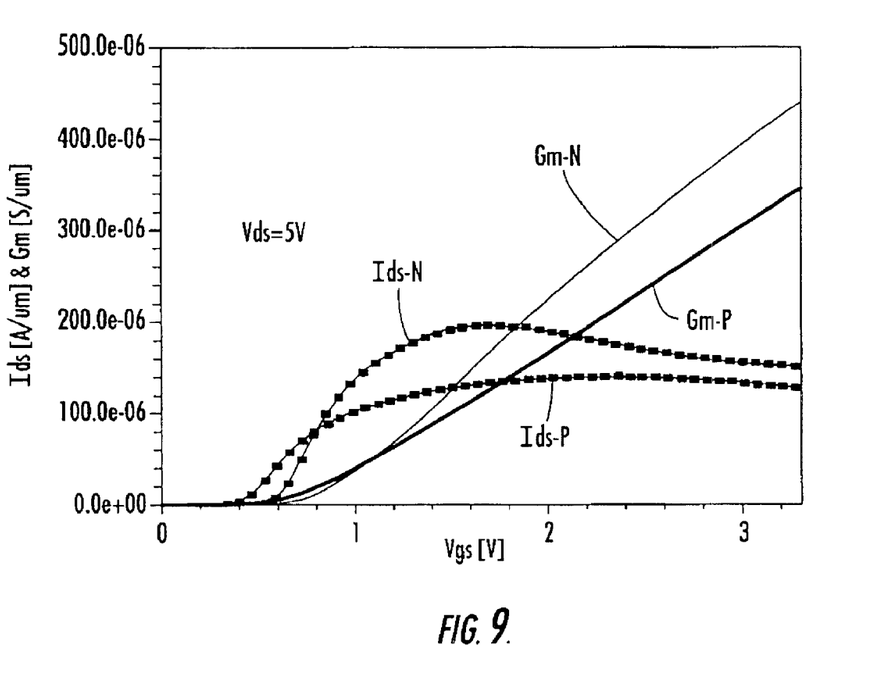
FIG. 9 is a graph illustrating the variation of the transconductance and saturation current as a function of the voltage Vgs relative to an N-channel LDMOS transistor and a P-channel LDMOS transistor according to the invention.

Additionally, computer simulation was used to compare the performance in terms of saturation current Ids and transconductance Gm of an N-channel LDMOS transistor similar to that of FIG. 6 (in other words, having partial siliciding) with that of a P-channel LDMOS transistor, similar to that of FIG. 8, having partial siliciding of the active area 19'. With reference to this comparison, FIG. 9 shows the variation of the gate-source voltage (Vgs) due to the simulation of the transconductance of the N-channel transistor (curve Gm-N), the transconductance of the P-channel transistor (curve Gm-P), the Ids current of the N-channel transistor (curve Ids-N), and the Ids current of the P-channel transistor (curve Ids-P). These variations were obtained for a drain-source voltage (Vds) of 5 V.

It should be noted that the threshold voltages Vt for both transistors are very similar, being approximately 0.5 V in each case. An N-channel transistor of the type shown in FIG. 6 was also constructed and tested, showing a performance closely matching that found by the simulations. In particular, a cut-off frequency of more than 20 GHz was measured. For the P-channel transistor, since the cut-off frequency is correlated with the maximum transconductance and the gate capacities, which can be considered similar to those of the N-channel transistor, the cut-off frequency for the P-channel transistor can be estimated as approximately 14–15 GHz. Additionally, since the same parameters for the implantation of the doped regions were assumed for the simulation which was conducted, the P-channel transistor can be considered to have a breakdown voltage of 15 V, in other words a value similar to that of the N-channel transistor.

As stated above, the present invention is also applicable to conventional P-channel or N-channel MOS transistors which can be formed on the same wafer 30 or on a different wafer. In relation to the above, in FIG. 7 the number 400 indicates an example of an N-channel MOS transistor according to the present invention. The transistor 400 comprises the wafer 30, a first and a second active region 33 and 34, a gate oxide layer 32 formed over a surface 45 of the epitaxial layer 2, a layer of conductive material 35 (polysilicon or metal, for example) and two lateral spacers 36a and 36b. The first active region 33 comprises a drain region 37 which is strongly doped ($N^+$) and a region 38 which is weakly doped ($N^-$). The second active region 34 comprises a source region 39 which is strongly doped ($N^+$) and a region 40 which is weakly doped ($N^-$).

Figure 7:
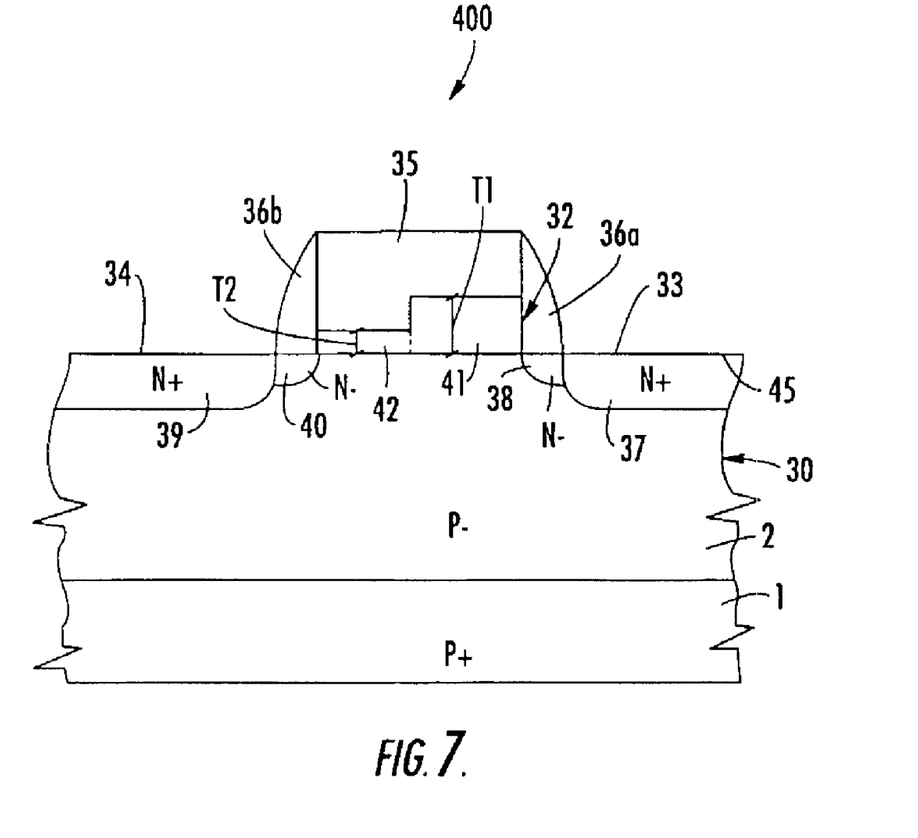
FIG. 7 is a schematic cross-sectional view illustrating an N-channel MOS transistor according to a particular embodiment of the invention.

The gate oxide layer 32 has a first portion 41 having a first thickness T1 and a second portion 42 having a second thickness T2 which is different from the thickness T1. In particular, the first portion 41 is close to the first active region 33, and its thickness T1 is greater than the thickness T2. The first portion 41 of the gate oxide 32 advantageously has a thickness such that it is possible to obtain breakdown voltages higher than those of conventional MOS transistors using a gate oxide with uniform thickness. With reference to the transconductance Gm of the transistor 400, it should be noted that by using different thicknesses of the gate oxide the value of the breakdown voltage can be increased at a cost in terms of transconductance which is smaller than the cost incurred when the uniform thickness is increased with the thickness of the gate oxide in a conventional MOS.

Additionally, the process of siliciding the polysilicon layer 35, a first active area 33 including the surfaces of the regions 37 and 38, and a second active area 34 including the surfaces of the regions 39 and 40 can also be applied to the transistor 400, in a similar way to that described with reference to FIGS. 5 and 6. In particular, it is possible to arrange for the first active area 33 to be only partially silicidized. For example, the weakly doped region 38 can be kept free of silicide by using a protective oxide element (not shown) similar to the element 36 of FIG. 6.

The method of manufacturing the transistors 100, 200, 300, and 400 is completed with the formation of suitable metallic contacts (not shown) on the corresponding drain and source regions, and on the body contact region if present. Clearly, a person skilled in the art may further modify and vary the method and transistors according to the present invention, in order to meet contingent and specific requirements, all such modifications and variations being included within the scope of protection of the invention as defined by the following claims.

That which is claimed is:

1. A metal oxide semiconductor transistor integrated in a substrate of semiconductor material and comprising:
   a gate structure located on one surface of the substrate and including an insulating gate layer, a gate electrode on the insulating gate layer, and lateral spacers extending from the surface of the substrate on lateral walls of the insulating gate layer and the gate electrode;
   the insulating gate layer comprising a first portion having a first thickness and a second portion having a second thickness that is less than the first thickness;
   a first active region including a drain region; and
   a second active region spaced apart from the first active region and including a source region;
   the first and second active regions being integrated in the substrate, the first portion of the insulating gate layer being adjacent to the first active region, and the second portion being adjacent to the second active region;
   the first thickness provides a predetermined value of the breakdown voltage of the transistor, and the second thickness provides a predetermined value of the transconductance of the transistor.

2. The metal oxide semiconductor transistor according to claim 1, wherein the first portion and the second portion of the insulating gate layer are superimposed, respectively, on at least one part of the first active region and at least one part of the second active region.

3. The metal oxide semiconductor transistor according to claim 1, wherein the transistor comprises a lateral double-diffusion MOS transistor.

4. The metal oxide semiconductor transistor according to claim 3, wherein the second active region comprises a body region, and the second portion of the gate insulating layer is superimposed on at least one part of the body region.

5. The metal oxide semiconductor transistor according to claim 1, wherein the transistor is a MOS transistor.

6. The metal oxide semiconductor transistor according to claim 1, wherein the gate electrode comprises polysilicon and a layer of silicide on a surface of the polysilicon.

7. The metal oxide semiconductor transistor according to claim 1, wherein the first and second active regions extend from the surface of the substrate towards an interior of the insulating gate layer and comprise, respectively, a first and a second silicide surface layer.

8. The metal oxide semiconductor transistor according to claim 7, wherein the first silicide surface layer only partially covers the first active region.

9. The metal oxide semiconductor transistor according to claim 8, wherein the first silicide surface layer covers at least the drain region and is interrupted in such a way that a surface area of the first active region adjacent to the first portion of the gate insulating layer is not covered with silicide.

10. The metal oxide semiconductor transistor according to claim 7, wherein the first silicide surface layer comprises at least one of titanium silicide ($TiSi_2$), cobalt silicide ($CoSi_2$), and tungsten silicide ($WSi_2$).

11. The metal oxide semiconductor transistor according to claim 1, wherein the substrate comprises a lower portion having a first type of conductivity and an epitaxial layer thereon having the first type of conductivity, the epitaxial layer having a conductivity lower than the conductivity of the lower portion.

12. A method for manufacturing a metal oxide semiconductor field-effect transistor the method comprising:
   providing a semiconductor substrate;
   forming, in the substrate, a first active region, including a drain region;
   forming, in the substrate, a second active region spaced apart from the first region and including a source region;
   forming a layer of gate oxide on a surface of the substrate, the layer of gate oxide including a first portion having a first thickness and a second portion having a second thickness less than the first thickness, forming the gate oxide comprising selecting the first thickness to obtain a specified breakdown voltage of the transistor, and selecting the second thickness to obtain a specified value of transconductance of the transistor;
   forming a gate electrode on the gate oxide layer; and
   forming lateral spacers extending from the surface of the substrate on lateral walls of the insulating gate layer and the gate electrode;
   the first portion and the second portion of the gate oxide being adjacent, respectively, to the first active region and to the second active region.

13. The method according to claim 12, wherein the forming the gate oxide layer comprises:
   forming a first layer of oxide on the surface of the substrate, the first layer of oxide having a thickness in the range from the second thickness to the first thickness;
   removing a portion of the first layer of oxide to expose a region of the surface of the substrate;
   growing a second layer of oxide on the region of the surface of the substrate and on a remaining portion of the first layer of oxide and having a thickness substantially equal to the second thickness, the combined thickness of the remaining portion of the first layer of oxide and the second layer of oxide on the remaining portion of the first layer of oxide is substantially equal to the first thickness;

delimiting the gate oxide layer by removing a portion of the second layer of oxide on the region of the surface of the substrate and portions of the superimposed first layer of oxide and second layer of oxide.

14. The method according to claim 12, wherein the transistor comprises a lateral double-diffusion MOSFET; and forming the first and the second active region comprises forming a drift region and a body region.

15. A The method according to claim 14, wherein the active region extends at least partially under the second portion.

16. The method according to claim 12, wherein the transistor comprises a MOS transistor.

17. The method according to claim 12, further comprising forming a first layer of silicide on at least one portion of a first surface of the first active region and a second layer of silicide on a second surface of the second active region.

18. The method according to claim 17, wherein the first silicide surface layer only partially covers the first active region.

19. The method according to claim 18, wherein the first silicide surface layer covers at least the drain region and is interrupted in such a way that an area of the surface of the first active region adjacent to the first portion of the gate oxide is not covered with silicide.

20. The method according to claim 19, wherein forming the first silicide layer comprises:

forming a shielding element on the area of the surface of the first active region;

depositing a refractory metal on at least the drain region; and applying heat treatment to the wafer to form the first silicide layer.

21. The method according to claim 18, wherein the first silicide layer is formed by self-aligned silicidizing.

* * * * *